United States Patent
Damarla et al.

[11] Patent Number: 5,745,500
[45] Date of Patent: Apr. 28, 1998

[54] BUILT-IN SELF TESTING FOR THE IDENTIFICATION OF FAULTY INTEGRATED CIRCUIT CHIPS IN A MULTICHIP MODULE

[75] Inventors: Thyagaraju Damarla, Eatontown, N.J.; Moon J. Chung, Okemos, Mich.; Wei Su, Staten Island, N.Y.; Gerald T. Michael, Ocean, N.J.

[73] Assignee: The United States of America as represented by the Secretary of the Army, Washington, D.C.

[21] Appl. No.: 734,819

[22] Filed: Oct. 22, 1996

[51] Int. Cl.$^6$ ........................................ G01R 31/28
[52] U.S. Cl. .................. 371/22.4; 371/22.5; 395/183.06
[58] Field of Search .......................... 371/22.4, 22.1, 371/22.5, 25.1, 22.33, 27.1, 27.2; 395/421.07, 183.06, 183.01, 183.03, 185.01; 364/489, 578, 717, 718, 737; 324/765

[56] References Cited

U.S. PATENT DOCUMENTS

| | | | |
|---|---|---|---|
| 5,173,906 | 12/1992 | Drebelbis et al. | 371/22.5 |
| 5,301,199 | 4/1994 | Ikenaga et al. | 371/22.5 |
| 5,442,641 | 8/1995 | Beranger et al. | 371/21.2 |
| 5,515,383 | 5/1996 | Katoozi | 371/22.4 |
| 5,535,164 | 7/1996 | Adams et al. | 365/201 |
| 5,583,786 | 12/1996 | Needham | 364/488 |
| 5,617,531 | 4/1997 | Crouch et al. | 395/183.06 |
| 5,619,512 | 4/1997 | Kawashima et al. | 371/22.5 |

*Primary Examiner*—Robert W. Beausoliel, Jr.
*Assistant Examiner*—Nadeem Iqbal
*Attorney, Agent, or Firm*—Michael Zelenka; John M. O'Meara

[57] ABSTRACT

A built-in self test method and circuit identifies a faulty integrated circuit chip in a multichip module. The built-in self test method first applies a test pattern to a multichip module having a plurality of integrated circuit chips and to a reference signal generator, generates a first and second reference signal representing test responses for a fault free multichip module, compresses the outputs from the multichip module into a first and second bit using a first and second linear space compressor, uses exclusive OR logic to combine the first bit with the first reference signal to produce a first fault detection output and to combine the second bit with the second reference signal to produce a second fault detection output, stores the first and second fault detection outputs in a pair of N-bit shift registers; compares the stored outputs to detect a fault condition, and applies a series of recursive logic operations to identify the faulty integrated circuit chip in the multichip module. The built-in self test circuit includes a test pattern generator, a reference signal generator, at least two linear space compressors, at least two N-bit shift registers, and a plurality of logic gates. Identification of the faulty integrated circuit chip in an multichip module using the present invention thereby facilitates the replacement of the specific faulty chip in order to repair the multichip module.

12 Claims, 5 Drawing Sheets

BUILT-IN SELF TESTING FOR THE IDENTIFICATION OF FAULTY INTEGRATED CIRCUIT CHIPS IN A MULTICHIP MODULE

GOVERNMENT INTEREST

The invention described herein may be manufactured, used, imported, sold, and licensed by or for the government of the United States of America without the payment to us of any royalty thereon.

FIELD OF THE INVENTION

This invention relates to the field of testing integrated circuits, and more particularly, to a built-in self-test method and circuit for identifying faulty integrated circuit chips in multichip modules (MCMs), and the like.

BACKGROUND OF THE INVENTION

Fault detection and fault identification have been the subject of intensive research by both industry and universities for well over three decades. In the early days, research on fault detection and identification mainly focused on utilizing error detecting and correcting codes drawing parallels from error correcting codes developed in information theory. In this approach, system output is encoded into some known codes by augmenting the output bits of a system with parity bits. These parity bits are generated in the system independently as functions of input variables and they are used as reference parity bits. The reference parity bits are then compared with the parity bits generated from the system outputs. If they both match, the system is declared fault free, else the system is declared faulty.

While the earlier research focused on error detecting and correcting codes for identification of faulty functions in a system, signature analysis has been commonly employed for identification of faulty bits. In signature analysis, a signature is generated for the output of a device using a component such as a linear feedback shift register (LFSR) and then compared with a reference signature. Due to its simplicity and effectiveness, signature analysis has become the predominantly used method for built-in self test (BIST) schemes used for very large scale integrated circuits (VLSI).

As is known in the art, a multichip module (MCM) in its most basic form is a single electronic package containing a plurality of integrated circuit chips interconnected to implement a system function of the module. MCMs are generally defined by such characteristics as packaging efficiency, chip population, and input/output density to name a few. In recent years, the growth of MCMs is on the rise and it has been estimated by some that the MCM market would approach $24 billion by the year 2000. As MCM technology becomes more and more sophisticated, the number of chips mounted on MCMs (i.e., chip population) is increasing rapidly. Furthermore, the majority of the chips mounted on MCMs are application specific integrated circuits (ASICs) which are generally very expensive. Consequently, the need to repair faulty MCMs is becoming more and more important, since discarding the faulty MCMs can be very costly. As such, there is an increasing need for speedy identification of the faulty chip or chips on an MCM and replacement thereof.

Integrated circuit chips which are not provided with BIST capabilities are typically subjected to in-circuit testing with external automated test equipment (ATE) with fault diagnosis performed using fault dictionaries. Moreover, because of the high density of chips now used on MCMs, the majority of chips are provided with boundary scan registers in which test vectors are shifted in and test responses are shifted out. In a typical prior art testing scheme for MCMs using signature analysis, test patterns are generated by a parallel random pattern source and are shifted into various chips using scan in (SI) ports. Corresponding test responses of the chips are then collected in a multiple input shift register (MISR) which generates the signature for the whole module. Whether the MCM is faulty or fault free is determined by comparing the signature from the MISR with the expected signature for a fault free MCM. However, this method does not identify the specific faulty integrated circuit chip on the MCM.

In another type of boundary scan testing for MCMs, an array of boundary scan cells are fabricated within the MCM. Devices utilizing this approach typically partition the scan cells so that selected portions of the MCM can be isolated for testing. The specific disadvantage with this approach is the additional design requirements for the boundary scan cells which can result in overall design and fabrication limitations in the MCM. In general, there are several disadvantages in existing MCM testing schemes with the major disadvantages being the inability to accurately and rapidly identify a specific faulty integrated circuit chip within an MCM, requirements for external testing equipment, and the insufficient use of data compression schemes to optimize built-in self testing of complex modules.

Consequently, while some advances have been made in testing integrated circuit chips and multichip modules (MCMs), these advances have not yet produced a method or device which both detects faults in an MCM and identifies the specific faulty integrated circuit chip on an MCM to facilitate repair in an expedient and cost effective manner.

SUMMARY OF THE INVENTION

Accordingly, it is an object of the present invention to provide a scheme for built-in self testing of multichip modules (MCMs) which both detects faults and also identifies the specific faulty chip on the MCM.

It is another object of the present invention to use data compression techniques in order to optimize the built-in self testing functionality of complex MCMs.

It is another object of the present invention to provide a scheme for built-in self testing which facilitates the expedient and cost effective repair of MCMs.

These and other objects of the invention are achieved by using a test pattern generator, a reference signal generator, two linear space compressors, two N-bit shift registers, an array of logic gates to generate a fault identification vector, a register for storing the vector, and a clock generator. In the present invention, a test pattern from the test pattern generator is applied to an MCM under test and to the reference signal generator. It is assumed that the MCM is comprised of a plurality of integrated circuit chips, and that a faulty chip may generate many erroneous outputs representing test responses. Outputs from all of the chips in the MCM are compressed into two bits using the linear space compressors. The outputs from the space compressors are compared with two reference signals (corresponding to a fault free system) generated by the reference signal generator using exclusive OR logic and the N-bit shift registers. If they differ, a fault is detected and $N=\log_2(M+1)$ consecutive outputs from the N-bit shift registers from the instant a fault is detected are then used to identify the faulty chip, where M denotes the number of functions (chips) in the MCM. Faulty reference signals are also detected and identified using the scheme in the present invention.

The present invention applies to MCMs having a plurality of integrated circuit chips. For purposes of the invention, it is assumed that under normal operating conditions only one integrated circuit chip is faulty at any given time, however, that particular chip may generate several faulty outputs representing test responses. If a chip has multiple outputs, then identification of the faulty function in turn identifies the faulty chip. Alternatively, for a chip having multiple outputs, a single output for the chip can be obtained through the use of exclusive OR (EXOR) logic. Using EXOR logic to generate a single output from a chip having multiple outputs would typically result in canceling an even number of faults. However, this situation is avoided when a large number of test patterns are applied to a chip so that some faults would appear at the EXORed output enabling the fault detection mechanism to detect the faults. Either scheme can be used while implementing the built-in self test (BIST). The present invention thereby overcomes the shortcomings of the prior art by enabling the identification of a faulty chip by identifying the faulty function of that chip. Once the chip is identified, it can be replaced so that the MCM is repaired. For implementation purposes, the present invention can be configured as a Field Programmable Gate Array (FPGA) which can be disposed on the MCM itself. The present invention will provide the greatest payoff in the area of MCM design for both military and commercial applications because of the testing and diagnostic efficiencies that can be recognized. In particular, the present invention would be extremely useful in depot-level and operator-level maintenance operations as well as in commercial applications involving the direct emulation of digital microelectronics circuits. Furthermore, this invention can be beneficially used in the design of VLSI systems and can be incorporated at the multichip module, board, or system level. For the most part, anyone involved in the design of MCMs having the intent to identify failed components as part of the MCM design could use this invention. Examples of such systems which derive the most benefit from a built-in self test scheme according to the principles of this invention include microprocessor systems, memory systems and any other digital system boards. For new digital systems, manufacturing and testing of MCMs and boards could be performed with greater speed. By placing the burden of notification of test failure and notification of the failed chip on each digital module, most testing may be performed in parallel on the digital modules when the board is placed in test mode.

Thus, the illustrative embodiments of the invention shown and described herein largely overcome the shortcomings of the prior art by providing a scheme for built-in self testing of complex MCMs in a speedy and cost effective manner by enabling the identification of the specific faulty integrated circuit chip without adversely affecting overall MCM design and performance.

BRIEF DESCRIPTION OF THE DRAWINGS

The features of the invention will be readily understood in light of the following Detailed Description of the Invention and the attached drawings, wherein.

It should be noted that all like reference numerals identify the same element of the invention.

DETAILED DESCRIPTION OF THE INVENTION

Figure 1:
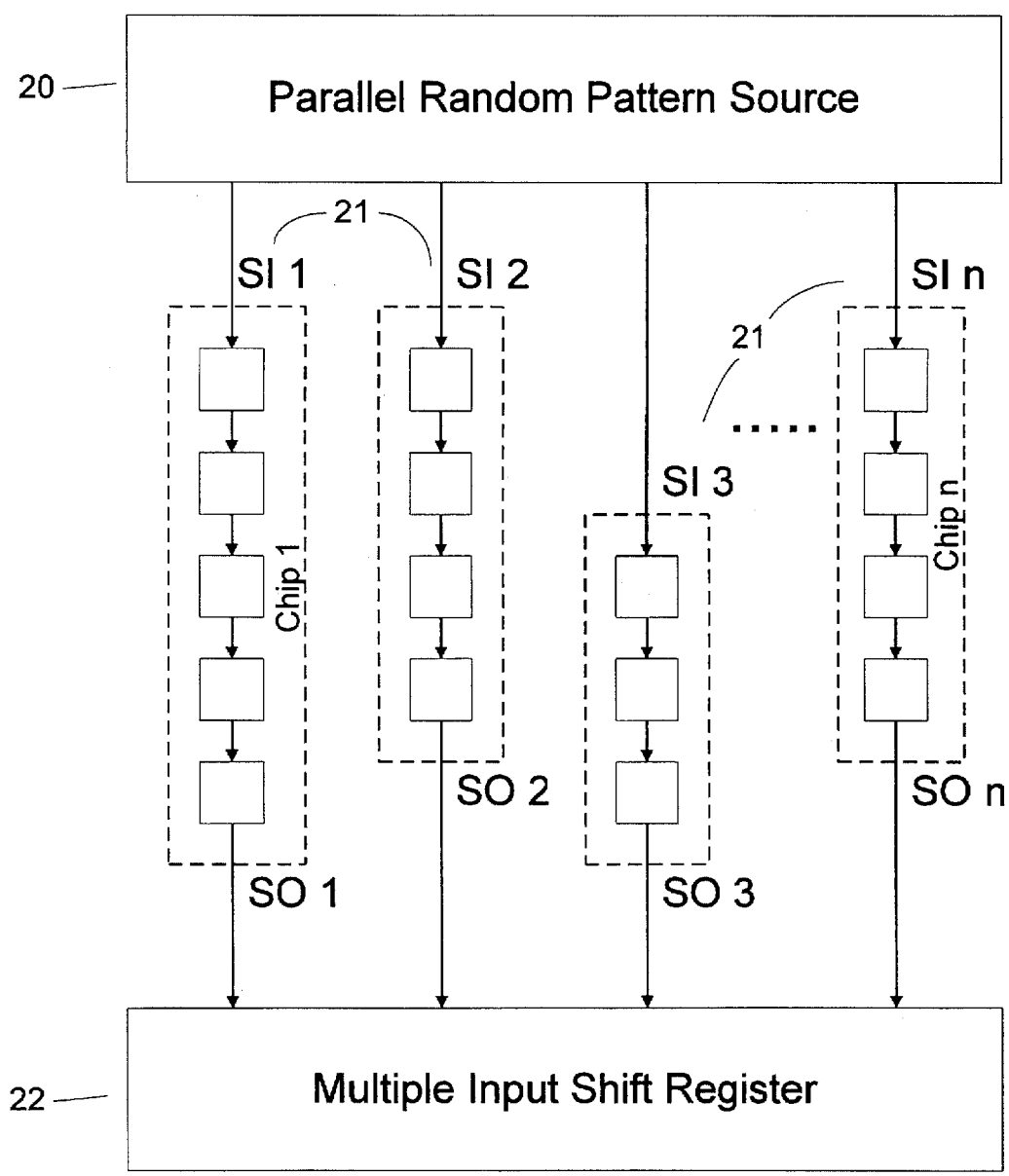
FIG. 1 is a schematic block diagram which depicts a typical prior art scheme for testing multichip modules (MCMs)

For a more detailed appreciation of the present invention, attention is first invited to FIG. 1 which depicts a typical prior art scheme for multichip module (MCM) testing. As shown, test patterns are typically generated by a parallel random pattern source 20 and are shifted into various chips using scan in (SI) ports 21. Corresponding test responses of the chips are then collected in a multiple input shift register (MISR) 22 which generates the signature for the whole module. Whether the MCM is faulty or fault free is determined by comparing the signature from the MISR with the expected signature for a fault free MCM. As stated, the major disadvantage associated with this testing approach is that the individual faulty integrated circuit chip or chips are not identified and, therefore, this scheme does not facilitate the cost effective and timely repair of MCMs which are comprised of many expensive application specific integrated circuits (ASICs).

Figure 2:
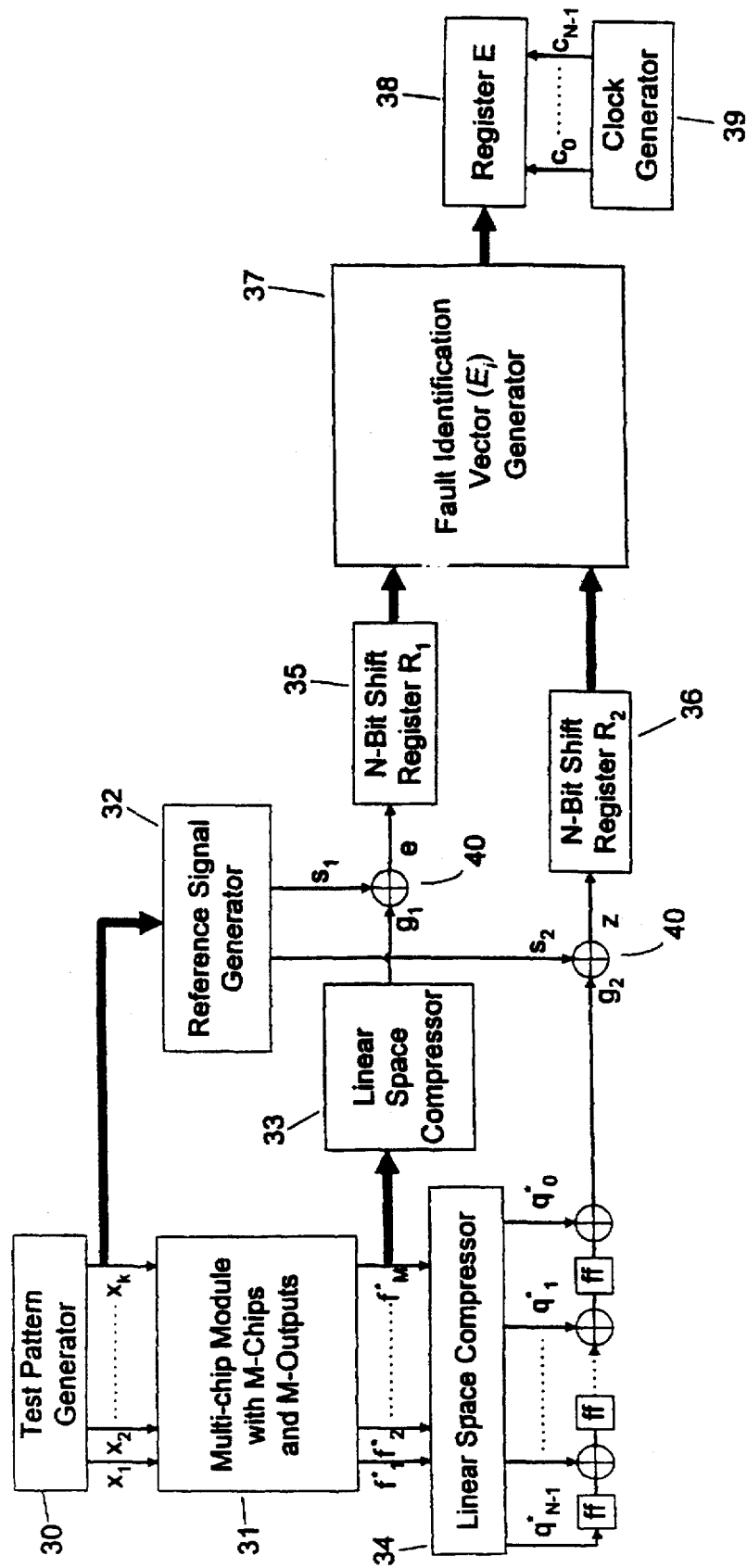
FIG. 2 is a schematic block diagram illustrative of a preferred embodiment of the present invention.

Referring to FIG. 2, a built-in self test method according to the principles of the invention is implemented using a test pattern generator 30, a reference signal generator 32, linear space compressors 33 and 34, N-bit shift registers 35 and 36, fault identification vector generator 37 including an array of logic gates (not shown), a register 38 for storing the fault identification vector including a plurality of individual flip-flops (not shown), a clock generator 39, and a plurality of exclusive OR (EXOR) logic gates 40.

In operation, it is assumed that the faults would occur in only one chip of a multichip module (MCM) 31. Furthermore, while each of the chips has at least one output representing a test response (i.e., multiple outputs), it is also assumed that multiple outputs from any given chip will be EXORed to generate a single output per chip. If multiple chips on MCM 31 are faulty, then it is assumed that the test responses do not overlap from any two faulty chips for $N=\log_2(M+1)$ test vectors, where M denotes the number of functions (chips) in MCM 31. The fault may manifest itself as multiple errors resulting in several erroneous outputs from the faulty chip for several test vectors. In general, not more than one chip fails in MCM 31 at a time. For such a system, identification of the faulty chip would facilitate replacement of the faulty chip and repair of MCM 31.

Illustratively, the test pattern generator 30 randomly generates the required test patterns for both MCM 31 and the reference signal generator 32. For present purposes, assume the number of chips in MCM 31 is M and the corresponding outputs (i.e., test responses to the test pattern) for a fault free MCM are $f_1(X(t)), f_2(X(t)), \ldots, f_M(X(t))$, for the test pattern $X(t)=(x_1(t) x_2(t) \ldots x_k(t)$, applied at the instance t. For simplicity, $f_i(t)$ will be used instead of $f_i(X(t))$. For purposes of this discussion, the outputs of MCM 31 are denoted by $f^*_i$ and the outputs for a fault free MCM by $f_i$. Similarly, $q^*_i$ is used to denote the output of the linear space compressor 34.

A linear space compressor 33 is used to compress the outputs $f^*_i$ of MCM 31 for all $i=\{1,2,\ldots,M\}$ to generate a first compressed output $g_i(t)$ through the use of exclusive OR logic so that $$g_1(t) = f^*_1(t) \oplus f^*_2(t) \oplus f^*_3(t) \oplus \ldots \oplus f^*_M(t). \quad \text{(EQ 1)}$$

The test responses $f^*_1(t), f^*_2(t), \ldots, f^*_M(t)$ are also compressed in linear space compressor 34 into $N = \lceil \log_2(M+1) \rceil$ bits, where $\lceil n \rceil$ denotes the smallest integer greater than or equal to $n$. The output of linear space compressor 34 is given by $Q(t) = [H][F(t)]^T$, or:

$$\begin{bmatrix} q^*_0(t) \\ q^*_1(t) \\ q^*_2(t) \\ \cdot \\ \cdot \\ \cdot \\ q^*_{N-1}(t) \end{bmatrix} = \begin{bmatrix} 101010 \ldots 101 \\ 011001 \ldots 011 \\ 000111 \ldots 111 \\ 000000 \ldots 111 \\ 000000 \ldots 111 \end{bmatrix} \begin{bmatrix} f_1^*(t) \\ f_2^*(t) \\ f_3^*(t) \\ \cdot \\ \cdot \\ f_M^*(t) \end{bmatrix} \quad \text{(EQ 2)}$$

where the matrix [H] is a check matrix used for single error correcting and double error detecting codes and the addition is an exclusive OR (EXOR) operation. For example, $q_0(t)$ in Equation 2 is given by $$q^*_0(t) = f^*_1(t) \oplus f^*_3(t) \oplus f^*_5(t) \oplus \ldots \oplus f^*_M(t).$$

Notice from Equation 2 for the faulty function $f^*_i = f^*_{i = i_{N-1} \ldots i_1 i_0}$, where $i_{N-1} \ldots i_1 i_0$ is the binary representation of the index 'i' of the function $f^*_i$, the parity bits that will be affected are given by $q_{i_j}$, if $i_j = 1$. For example, if $f_{13=(1101)}$ is faulty then $q^*_3$, $q^*_2$ and $q^*_0$ will be affected.

The outputs of linear space compressor 34 are then further combined into a second compressed output $g_2(t)$ through a series of exclusive OR (EXOR) operations so that the faulty function (ff) can be identified, where $$g_2(t) = q^*_0(t) \oplus q^*_1(t-1) \oplus \ldots \oplus q_{N-1}^*(t-N+1). \quad \text{(EQ 3)}$$

A first and second reference signal $s_1$ and $s_2$, which are the counter parts of $g_1$ and $g_2$, are generated by reference signal generator 32 in response to the test pattern applied from test pattern generator 30 and are based on the outputs of a fault free MCM so that $$s_1(t) = f_1(t) \oplus f_2(t) \oplus \ldots \oplus f_M(t)$$

$$s_2(t) = q_0(t) \oplus q_1(t-1) \oplus q_2(t-2) \oplus \ldots \oplus q_{N-1}(t-N+1) \quad \text{(EQ 4)}$$

where $f_i(t)$ and $q_i(t)$ correspond to a fault free MCM. Signals $s_1$ and $s_2$ are generated by reference signal generator 32 by first collecting the outputs $f_i(X(t))$ for all $i = \{1, 2, \ldots, M\}$ for each test pattern applied. In general, several test patterns are applied to get the desired fault coverage. Then, $s_1(t)$ and $s_2(t)$ are computed for all $t$ using the above Equation 4. These signals are then implemented independently as functions of input $\{X\}$. Although it is shown in FIG. 2 that the input to the MCM 31 and reference signal generator 32 are the same, it is not necessary that they be the same. The only requirement is that for every instant $t$, the outputs $s_1(t) = g_1(t)$ and $s_2(t) = g_2(t)$, irrespective of how the reference signals are generated or which particular driving inputs are provided to the reference signal generator 32. Once the BIST scheme shown in FIG. 2 is incorporated into the system, it is used to detect and identify the faulty chips during the test mode by the following operations.

A first and second fault detection output, outputs 'e' and 'z' respectively (see FIG. 2), are derived from the following exclusive OR (EXOR) logic operations:

$$e(t) = s_1(t) \oplus g_1(t)$$

$$z(t) = s_2(t) \oplus g_2(t) \quad \text{(EQ 5)}$$

Figure 3:
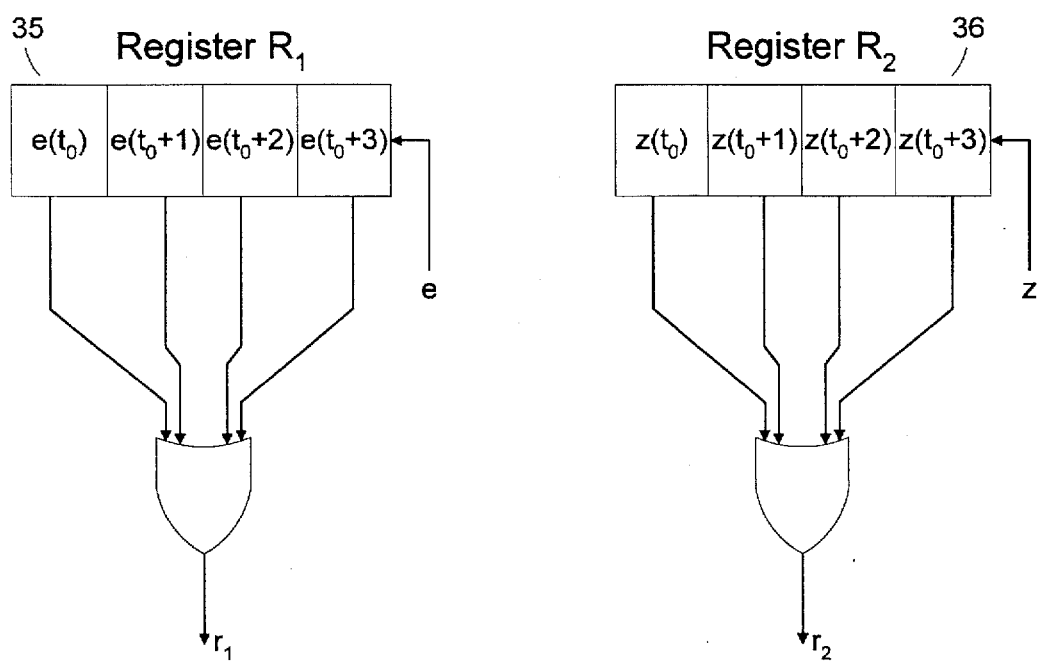
FIG. 3 is a schematic block diagram depicting the hardware configuration and associated data flow for the shift register components of the present invention.

The outputs 'e' and 'z' should be zero for a fault free MCM (i.e., absence of fault condition). If MCM 31 is faulty (fault condition present), then these outputs would be non-zero (i.e., logical value of '1') at various instants. From an information theoretic point of view, one would require $N = \log_2(M+1)$ number of bits to represent M different outputs where M represents the number of functions (integrated circuit chips) on MCM 31. This information is obtained from the outputs 'e' and 'z'. Therefore, N consecutive outputs of 'e' and 'z' are stored in the N-bit shift registers 35 and 36 respectively from the time a fault is first detected in order to identify the faulty function/chip. The output of N-bit shift register 35 is defined as $r_1$ and the output of N-bit shift register 36 is defined as $r_2$ as shown in FIG. 3. Fault detection is accomplished by comparing the outputs $r_1$ and $r_2$ as per the following table:

TABLE 1

| | Fault Detection | |
|---|---|---|
| $r_1$ | $r_2$ | Faulty Function |
| 0 | 0 | No faults |
| 0 | 1 | $s_2$ is faulty |
| 1 | 0 | $s_1$ is faulty |
| 1 | 1 | $f_1$ is faulty | where
$r_1 = e(t_0) \cup e(t_0 + 1) \cup \ldots \cup e(t_0 + N - 1)$
$r_2 = z(t_0) \cup z(t_0 + 1) \cup \ldots \cup z(t_0 + N - 1)$ The implementation of $r_1$ and $r_2$ in hardware is shown in FIG. 3 for the case N=4.

After fault detection, the specific faulty integrated circuit chip is then identified by applying a series of recursive logic operations. Specifically, in order to identify the faulty function, the faulty outputs $q^*_i$ from linear space compressor 34 must be determined. However, depending on the actual output values of $f^*_i$ from MCM 31 for the test vector applied at the instant $t$, $q^*_i$ would take different values. In order to identify which of the $q^*_i$ are faulty, a fault identification vector $E_i(t)$ is introduced, which is defined as:

$$E_i(t) = q_i(t) \oplus q^*_i(t). \quad \text{(EQ 6)}$$

$E_i(t)$ will always be '1' if $q^*_i$ is in error, that is the faulty function affects $q^*_i$, else $E_i(t)$ will be '0'. So, if $f_{12}$ is faulty at instant $t_0$, then it affects $q_3(t_0)$ and $q_2(t_0)$ but not others, hence $E(t_0) = E_3(t_0)E_2(t_0)E_1(t_0)E_0(t_0) = 1100$, where the vector $E(t)$ is given by $E(t) = (E_3(t)E_2(t)E_1(t)E_0(t))$.

Therefore, the problem of identifying faulty function is equivalent to determining the values of $E_i(t)$, for all $i = 0, 1, \ldots N-1$. From Table 1, if either $s_1$ or $S_2$ is faulty, it is immediately detected and identified. To illustrate, the first reference signal $s_1$ is identified as being faulty when the contents of N-bit shift register 35 have a logical value of 1 and the contents of N-bit shift register 36 have a logical value of 0. The second reference signal $s_2$ is identified as being faulty when the contents of N-bit shift register 36 have a logical value of 1 and the contents of N-bit shift register 35 have a logical value of 0. An integrated circuit chip in MCM 31 is identified as faulty when the contents of N-bit shift registers 35 and 36 both have a logical value of 1.

Figure 4:
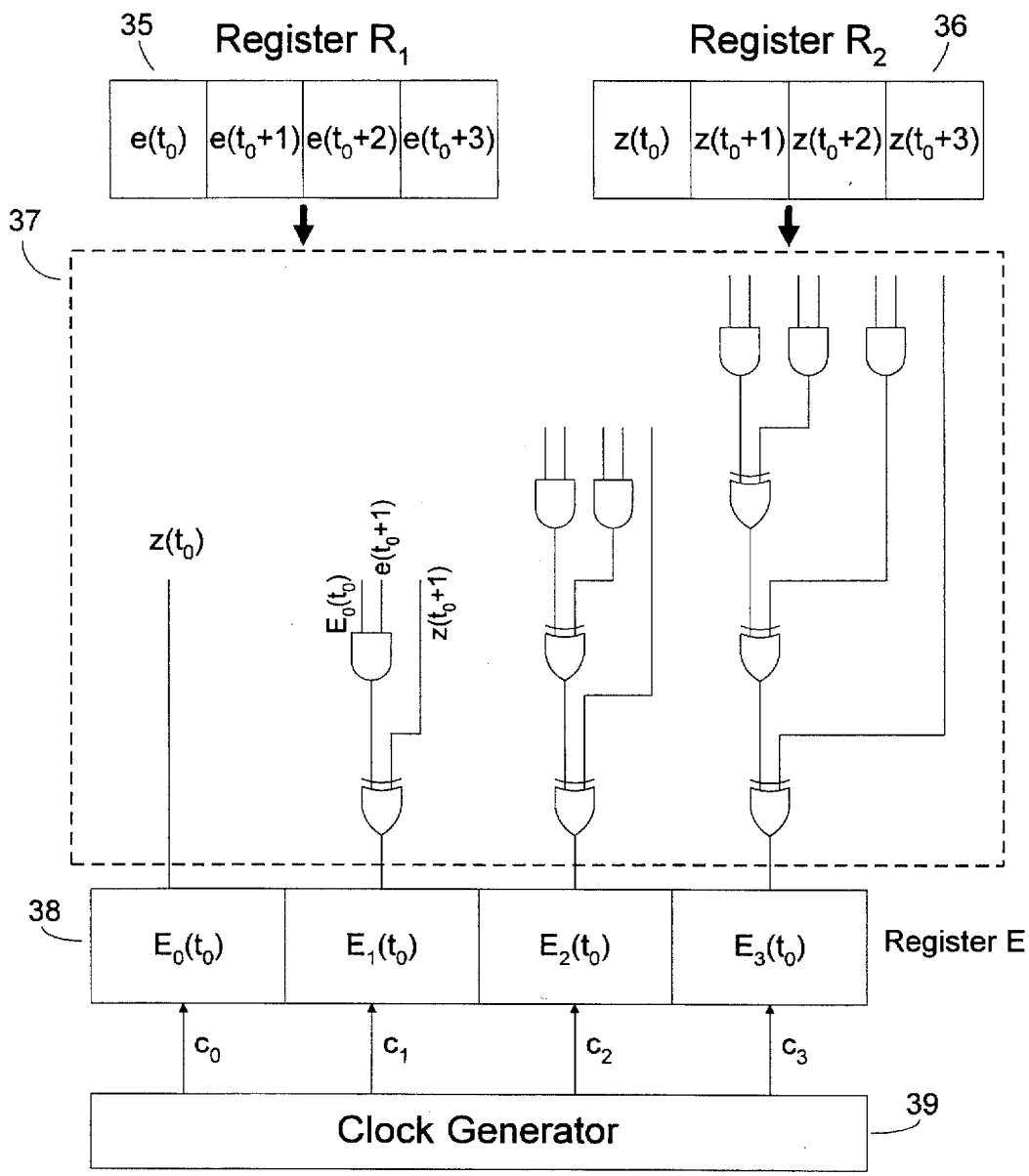
FIG. 4 is a schematic block diagram showing the hardware implementation of the identification process of the present invention.

In order to identify a faulty function $f^*_i$ of MCM 31, the values of $E_i(t)$ are determined using N consecutive outputs of 'e' and 'z', which are stored in N-bit shift registers 35 and 36 respectively, from the time a fault is first observed as shown in FIG. 4. Specifically, $t_0$ is the instant when the fault is first observed and the observed values of 'e' and 'z' are defined as:

$$e(t_0), e(t_0+1), \ldots, e(t_0+N-1)$$

$$z(t_0), z(t_0+1), \ldots, z(t_0+N-1)$$

Then, the relationships between the observed values of 'e' and 'z' and are given by $$E_0(t_0) = z(t_0), \quad \text{(EQ 7)}$$

and subsequent values of $E_i(t_0)$ for all $i=0,1,\ldots,N-1$ are determined using the following recursive equations, $$E_1(t) = z(t_0+1) \oplus E_0(t_0+1) \oplus E_1(t_0+1-1) \oplus \ldots \oplus E_{l-1}(t_0+1)$$
$$\text{for all } l>0 \quad \text{(EQ 8)}$$

and $$E_i(t_0+l) = E_i(t_0) \cdot e(t_0+l) \text{ for all } l \text{ where } l \text{ is an integer.} \quad \text{(EQ 9)}$$

This sequential generation of fault identification vector $E_i(t)$ can be accomplished by using an array 37 of logic gates shown in FIG. 4. The index of the faulty integrated circuit chip is then computed from the stored value of $E_i(t)$ in register 38 which is comprised of $N=\log_2(M+1)$ individual flip-flops (not shown).

The method for identification of a faulty function and hence a faulty chip is better understood with the following example. Consider an MCM with fifteen functions/chips (i.e., $M=15$), and assume that the function $f_{12}$ is faulty. The following Table 2 presents the observed values of 'e' and 'z', which will be used to identify the faulty function, after the fault is detected at instant $t_0$.

Hence, $E_3E_2E_1E_0=1100$ is computed, thereby resulting in the faulty function being $f_{12}$. Thus, the identification of the specific faulty function/chip in an MCM is accomplished using the following process:

Step 1: Determine if there is a fault in the system by observing the outputs $r=r_1 \cup r_2$. If $r=1$, there is a fault, else there is no fault. Denote the first instant the fault is observed as $t_0$. Store the values of outputs $e(t_0), e(t_0+1), \ldots e(t_0+N-1)$ and $z(t_0), z(t_0+1), \ldots z(t_01), \ldots z(t_0+N-1)$.

Step 2: If $r_1=0$ and $r_2=1$, then declare $s_2$ as faulty and stop. If $r_1=1$ and $r_2=0$, then declare $s_1$ as faulty and stop. Else go to Step 3.

Step 3: Set $E_0(t_0)=z(t_0)$. Determine the values of $E_1(t_0), \ldots, E_{N-1}(t_0)$ using Equations 8 and 9 recursively.

Step 4: Compute the index of the faulty function from the values determined in Step 3.

Referring again to FIG. 4, a hardware implementation of the above identification process for an MCM with 15 functions/chips is shown. Registers $R_1$ and $R_2$, 35 and 36 respectively, are used to store the first and second fault detection outputs 'e' and 'z' respectively and register 38, which is constructed using a plurality of individual flip-flops (not shown), is used to store the fault identification vector $E_i(t)$. The number of flip-flops needed for register 38 is equal to $N=\lceil \log_2(M+1) \rceil$, where M denotes the number of functions (i.e., integrated circuit chips) in MCM 31 and $\lceil n \rceil$ denotes the smallest integer greater than or equal to n. The Boolean expressions $E_i(t_0)$ for $i \in \{0,1,2,3\}$ in FIG. 4 are derived from Equations 7, 8 and 9 and are repeated below for the sake of clarity:

$$E_0(t_0) = z(t_0) \quad \text{(from EQ 7)}$$

TABLE 2

| | | | Various outputs of MCM | | | | | | | | |
|---|---|---|---|---|---|---|---|---|---|---|---|
| $t_0+$ | $f_{15}$ | $f_{14}$ | ... | $f_1$ | $f^*_{15}$ | $f^*_{14}$ | ... | $f^*_1$ | $q_3q_2q_1q_0$ | $q_3^*q_2^*q_1^*q_0^*$ | e | z |
| 0 | 1000 | 1101 | 1001 | 001 | 1001 | 1101 | 1001 | 001 | 0100 | 1000 | 1 | 0 |
| 1 | 0011 | 1001 | 0011 | 111 | 0010 | 1001 | 0011 | 111 | 0011 | 1111 | 1 | 0 |
| 2 | 0000 | 0001 | 1111 | 000 | 0000 | 0001 | 1111 | 000 | 1000 | 1000 | 1 | 1 |
| 3 | 1110 | 0011 | 1010 | 101 | 1111 | 0011 | 1010 | 101 | 1101 | 0001 | 0 | 0 |

Note that faults occurred at several instants in $f_{12}$. To determine $E_0(t_0)$, Equation 7 is used to obtain $$E_0(t_0) = z(t_0) = 0$$

For determination of $E_1(t_0)$, Equation 8 is used. First, $E_0(t_0+1)$ is determined from Equation 9 as follows:

$$E_0(t_0+1) = E_0(t_0) \cdot e(t_0+1) = 0 \cdot 1 = 0$$

Applying Equation 8 then yields:

$$E_1(t_0) = z(t_0+1) \oplus E_0(t_0+1) = 0 \oplus 0 = 0$$

For determination of $E_2(t_0)$, Equation 9 yields $E_2(t_0+2)=0$ and $E_1(t_0+1)=0$ since $E_0(t_0)=0$ and $E_1(t_0)=0$. Applying Equation 8 then yields:

$$E_2(t_0) = z(t_0+2) \oplus E_0(t_0+2) \oplus E_1(t_0+1) = 1 \oplus 0 \oplus 0 = 1$$

Similarly, for determination of $E_3(t_0)$, $E_0(t_0+3)=E_1(t_0+2)=0$. Applying Equation 9, $$E_2(t_0+1) = E_2(t_0) \cdot e(t_0+1) = 1 \cdot 1 = 1$$

and then Equation 8, $$E_3(t_0) = z(t_0+3) \oplus E_0(t_0+3) \oplus E_1(t_0+2) \oplus E_2(t_0+1) = 0 \oplus 0 \oplus 0 \oplus 1 = 1.$$

$$E_1(t_0) = z(t_0+1) \oplus E_0(t_0) \cdot e(t_0+1) \quad \text{(from EQ 8, 9)}$$

$$E_2(t_0) = z(t_0+2) \oplus E_0(t_0) \cdot e(t_0+2) \oplus E_1(t_0) \cdot e(t_0+1) \quad \text{(from EQ 8, 9)}$$

$$E_3(t_0) = z(t_0+3) \oplus E_0(t_0) \cdot e(t_0+3) \oplus E_1(t_0) \cdot e(t_0+2) \oplus E_2(t_0) \cdot e(t_0+1) \quad \text{(from EQ 8, 9)}$$

Figure 5:
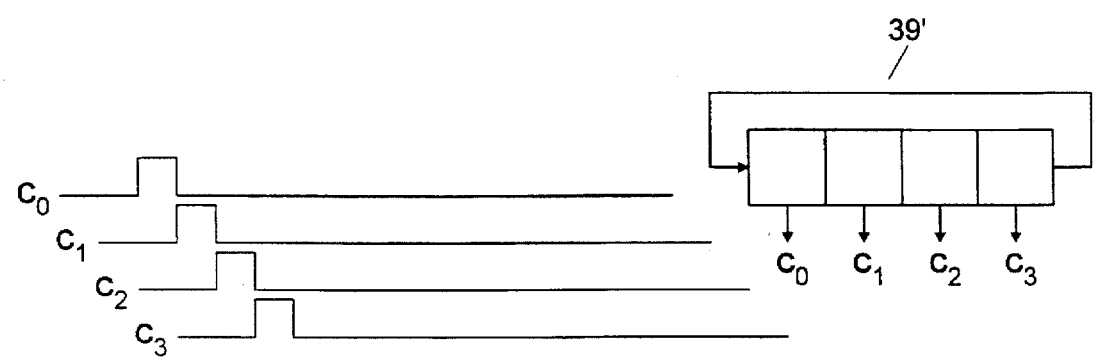
FIG. 5 is a timing diagram illustrative of the clock timing requirements for the present invention.

From the above equations, it can be seen that $E_i(t_0)$ depends on $E_j(t_0)$ for all $j<i$. Hence, the fault identification vector $E_i(t)$ is generated sequentially so that $E_0(t_0)$ is generated first, then $E_1(t_0)$, and so on. This is accomplished by receiving timing from a plurality of clock signals generated by clock generator 39 (FIG. 4), where each clock is on for a certain period and off the remainder of the time. The number of clock signals needed to generate $E_i(t)$ is $N=\lceil \log_2(M+1) \rceil$, where M denotes the number of functions (i.e., integrated circuit chips) in MCM 31 and $\lceil n \rceil$ denotes the smallest integer greater than or equal to n. Generation of the clock signals can be easily done by a circular shift register having $N=\lceil \log_2(M+1) \rceil$ flip-flops. For example, in the above case where $N=4$, generation of $c_0, c_1, c_2, c_3$ can be done by circular shift register 39' initialized with a "1000" pattern as shown in FIG. 5. The circuit given in FIG. 4 can also be easily generalized to any system with an arbitrary number of functions.

To implement the method according to the principles of the present invention, a built-in self test circuit therefore comprises: a test pattern generator for applying a test pattern to the multichip module; a reference signal generator coupled to the test pattern generator for generating a first and second reference signal; at least two data compressors for compressing the outputs from the plurality of integrated circuit chips in the multichip module into a first and second compressed outputs respectively; a logic circuit for adding the first compressed output from the first data compressor to the first reference signal to produce a first fault detection output and for adding the second compressed output from the second data compressor to the second reference signal to produce a second fault detection output; at least two registers coupled to the logic circuit for registering the first and second fault detection outputs respectively; a fault identification vector generator which uses the registered fault detection outputs; a storage device to store the fault identification vector; and a clock generator coupled to the storage device of the fault identification vector for generating a plurality of clock signals to sequentially order the generation of the fault identification vector.

In the most preferred embodiment, as shown in FIG. 2, a built-in self test circuit comprises a random test pattern generator 30, a reference signal generator 32, a first and second linear space compressor 33 and 34, exclusive OR logic circuitry 40 as the logic circuit, a first and second N-bit shift register 35 and 36, an array 37 of logic gates for generating the fault identification vector, a register 38 comprised of a plurality of flip-flops for storing the fault identification vector, and a circular shift register 39 as the clock generator.

For maximum testing and design efficiency, the built-in self test circuit is integrally formed within the multichip module. In the most preferred embodiment, the circuit is configured as a single field programmable gate array disposed on the multichip module.

Although the present invention has been described in relation to several different embodiments, we wish it to be understood that we do not desire to be limited to the exact details of construction shown and described, since obvious modifications will become apparent to a person skilled in the art. Therefore, the present invention should not be construed to be limited by the specific disclosure, but only by the appended claims.

What is claimed is:

1. A built-in self-test method for the identification of a faulty integrated circuit chip in a multichip module having a plurality of chips, comprising the steps of:

applying a test pattern to the multichip module, each of the chips being responsive to the test pattern and having at least one output representing a test response;

applying a test pattern to a reference signal generator, the reference signal generator generating first and second reference signals in response thereto, whereby the first and second reference signals represent test responses of a fault free multichip module;

compressing the outputs from the chips into first and second compressed outputs using first and second linear space compressors respectively;

deriving a first fault detection output by adding the first compressed output to the first reference signal using exclusive OR logic;

deriving a second fault detection output by adding the second compressed output to the second reference signal using exclusive OR logic;

storing the first and second fault detection outputs in first and second N-bit shift registers respectively;

comparing the stored outputs in the first and second N-bit shift registers to detect a fault condition; and applying a series of recursive logic operations to identify the faulty chip.

2. A built-in self-test method according to claim 1, wherein the outputs from each of the chips are combined into a single output per chip using exclusive OR logic.

3. A built-in self-test method according to claim 1, wherein said step of applying a test pattern to the multichip module and said step of applying a test pattern to the reference signal generator, each comprises randomly generating the test patterns.

4. A built-in self-test method according to claim 1, wherein the test pattern applied to the multichip module and the test pattern applied to the reference signal generator are the same test pattern.

5. A built-in self-test method according to claim 1, wherein said step of compressing the outputs from the chips into a first compressed output using a first linear space compressor comprises adding the outputs from the chips using exclusive OR logic.

6. A built-in self-test method according to claim 1, wherein said step of compressing the outputs from the chips into a second compressed output using a second linear space compressor comprises adding the outputs from the chips to a single error correcting and double error detecting code check matrix using exclusive OR logic.

7. A built-in self-test method according to claim 1, wherein said step of applying a series of recursive logic operations to identify the faulty chip comprises the steps of:

identifying the first reference signal as being faulty when the contents of the first N-bit shift register have a logical value of 1 and the contents of the second N-bit shift register have a logical value of 0;

identifying the second reference signal as being faulty when the contents of the second N-bit shift register have a logical value of 1 and the contents of the first N-bit shift register have a logical value of 0;

identifying one integrated circuit chip as being faulty when the contents of the first and second N-bit shift register both have a logical value of 1;

storing N consecutive values of the first and second fault detection outputs in the first and second N-bit shift registers from the instant a fault is detected, where $N=\log_2(M+1)$ and M denotes the number of chips in the multichip module;

sequentially generating a fault identification vector from the N consecutive values of the first and second fault detection outputs using an array of logic gates; and computing an index of the faulty chip from the fault identification vector using a register comprised of $N=\log_2(M+1)$ individual flip-flops, where M denotes the number of integrated circuit chips in the multichip module.

8. A built-in self-test method according to claim 7, wherein said step of sequentially generating a fault identification vector comprises receiving timing from a plurality of clock signals.

9. A built-in self-test circuit for the identification of a faulty integrated circuit chip in a multichip module having a plurality of chips, comprising:

a test pattern generator for applying a test pattern to the multichip module, each of the chips being responsive to the test pattern and having at least one output representing a test response;

a reference signal generator, coupled to and responsive to said test pattern generator, for generating first and second reference signals representing test responses of a fault free multichip module;

first and second data compression means for compressing the outputs from the chips into first and second compressed outputs respectively;

logic means for adding the first compressed output from the first data compression means to the first reference signal to produce a first fault detection output and for adding the second compressed output from the second data compression means to the second reference signal to produce a second fault detection output;

first and second means for registering the first and second fault detection outputs respectively, said first and second registering means coupled to said logic means, means for generating a fault identification vector based on the registered fault detection outputs, said generating means coupled to said first and second registering means;

means for storing the fault identification vector, said storing means coupled to said means for generating a fault identification vector; and a clock generator for generating a plurality of clock signals to sequentially order the generation of the fault identification vector, said clock generator coupled to said means for storing the fault identification vector.

10. A built-in self-test circuit according to claim 9, wherein:

said test pattern generator comprises a random test pattern generator;

said first and second data compression means comprise first and second linear space compressors respectively;

said logic means for adding the first compressed output to the first reference signal to produce a first fault detection output and for adding the second compressed output to the second reference signal to produce a second fault detection output comprises exclusive OR logic circuitry;

said first and second means for registering the first and second fault detection outputs comprises first and second N-bit shift registers;

said means for generating a fault identification vector comprises an array of logic gates;

said means for storing the fault identification vector comprises a register having $N=\log_2(M+1)$ individual flip-flops, where M denotes the number of chips in the multichip module; and said clock generator comprises a circular shift register.

11. A built-in self-test circuit according to claim 10, wherein said random test pattern generator, said reference signal generator, said first and second linear space compressors, said exclusive OR logic circuitry, said first and second N-bit shift registers, said array of logic gates, said register having $N=\log_2(M+1)$ individual flip-flops, and said circular shift register are integrally formed within the multichip module.

12. A built-in self-test circuit according to claim 10, wherein said random test pattern generator, said reference signal generator, said first and second linear space compressors, said exclusive OR logic circuitry, said first and second N-bit shift registers, said array of logic gates, said register having $N=\log_2(M+1)$ individual flip-flops, and said circular shift register are configured as a single field programmable gate array disposed on the multichip module.

* * * * *